(12) United States Patent
Cheng et al.

(10) Patent No.: US 8,460,976 B2
(45) Date of Patent: Jun. 11, 2013

(54) MANUFACTURING METHOD OF SOI HIGH-VOLTAGE POWER DEVICE

(75) Inventors: Xinhong Cheng, Shanghai (CN); Zhongjian Wang, Shanghai (CN); Yuehui Yu, Shanghai (CN); Dawei He, Shanghai (CN); Dawei Xu, Shanghai (CN); Chao Xia, Shanghai (CN)

(73) Assignee: Shanghai Institute of Microsystem and Information Technology, Chinese Academy of Sciences, Changning District, Shanghai (CN)

( * ) Notice: Subject to any disclaimer, the term of this patent is extended or adjusted under 35 U.S.C. 154(b) by 62 days.

(21) Appl. No.: 13/133,871

(22) PCT Filed: Sep. 7, 2010

(86) PCT No.: PCT/CN2010/076667
§ 371 (c)(1),
(2), (4) Date: Jun. 9, 2011

(65) Prior Publication Data
US 2012/0021569 A1 Jan. 26, 2012

(30) Foreign Application Priority Data
Jul. 6, 2010 (CN) .......................... 2010 1 0220370

(51) Int. Cl.
*H01L 21/332* (2006.01)

(52) U.S. Cl.
USPC ........... 438/135; 438/163; 438/311; 438/316; 438/335; 257/134; 257/138; 257/340; 257/347; 257/348; 257/E21.382; 257/E21.435

(58) Field of Classification Search
None
See application file for complete search history.

*Primary Examiner* — Julio J Maldonado
*Assistant Examiner* — Yasser Abdelaziez
(74) *Attorney, Agent, or Firm* — Global IP Services; Tianhua Gu

(57) ABSTRACT

The present invention relates to a manufacturing method of SOI devices, and in particular, to a manufacturing method of SOI high-voltage power devices. The method comprises steps of: forming a first oxide layer in a section on the surface of the SOI substrate; removing the first oxide layer to form a depressed area in the corresponding section of the upper surface of the SOI substrate; forming a second oxide layer, the upper surface of which is as high as the that of the SOI substrate, in the depressed area formed in step (B); performing photoetching and doping processes to form a P-type region, an N-type region and a gate region on the thus-formed structure where the second oxide layer is formed; forming a third oxide layer by deposition on the drift region of the structure after P-type and N-type regions are formed; wherein the total thickness of the third oxide layer and the second oxide layer approximates to the thickness of the buried oxide layer in the SOI substrate; and forming metal sub-regions, which are respectively in contact with the P-type region, the N-type region and the gate region, on the structure where the third oxide layer is formed, thereby forming a high-voltage power device.

7 Claims, 3 Drawing Sheets

MANUFACTURING METHOD OF SOI HIGH-VOLTAGE POWER DEVICE

CROSS REFERENCE TO RELATED PATENT APPLICATION

The present application is the U.S. national stage of PCT/CN2010/076667 filed on Sep. 7, 2010, which claims the priority of the Chinese patent application No. 201010220370.8 filed on Jul. 6, 2010, which application is incorporated herein by reference.

FIELD OF THE INVENTION

The present invention relates to a manufacturing method of SOI devices, and in particular, to a manufacturing method of SOI high-voltage power devices.

BACKGROUND OF THE INVENTION

Power integrated circuits, sometimes called high-voltage integrated circuits, constitute an important branch of the modern electronics, and can provide new types of circuits which feature high speed, high integration, low power consumption, and anti-irradiation for various power conversion and energy processing devices. Thus, they are widely applicable to the common consumption fields such as electric control systems, automotive electrics, display drivers, communications, and illumination, and applicable to other important fields such as national defense and aerospace. As applications thereof are increasingly popular, higher requirements are posed for the high-voltage devices in the core.

Power integrated circuits are usually combined with the high-voltage power transistor, control converter, monolithic logic functional devices, and the like, so high-voltage devices must be integrated with low-voltage logic devices on one chip. Silicon-on-insulator (SOI), as an ideal dielectric isolation material, can effectively isolate high-voltage modules from low-voltage modules and also isolate high-voltage devices from low-voltage devices, thus completely eliminating electrical interference and simplifying the design of the device structure. Meanwhile, the area of the SOI isolation region is smaller than that of the junction isolation, which greatly saves the die area, reduces the parasitic capacitance, and is convenient to integration of various circuits and devices. Therefore, application of the SOI technology is particularly advantageous in high-voltage devices and power integrated circuits, and has a wide application prospect.

IC products integrated with 600 V or above SOI high-voltage power devices are widely used in fluorescent lamps, switch power supply control, and the like. Compared with bulk-silicon SOI high-voltage devices, conventional SOI high-voltage devices can prevent extension of the depletion layer towards the substrate because of existence of the dielectric buried layer (BOX), and their vertical breakdown voltages are comparatively low. In general, design of 200 V or less SOI high-voltage devices is easier than that of 600 V or above SOI high-voltage devices.

The thickness of the top silicon of the SOI material has an effect on the critical breakdown electric field. When the silicon film is relatively thick (generally thicker than 1 μm), increased thickness will cause increased vertical breakdown voltage; however, when the silicon film is relatively thin (generally thinner than 1 μm), reduced thickness will cause decreased vertical breakdown voltage. Currently, the ideal fabricating method of 600 V or above SOI high-voltage devices is to adopt ultra-thin top silicon (0.2-0.5 μm thick), adopt shortened ionization integrating path to strengthen the vertical critical breakdown electric field of the silicon, and adopt linear doping of the drift region to realize uniform distribution of the electric field.

However, as the existing technique imposes a limit, the thickness of the top silicon of the SOI material is generally larger than 1 μm. In order to achieve the thickness of 0.2-0.5 μm, the technology of local oxidation of silicon, i.e. LOCOS, is developed. The existing technology has the following disadvantages: it takes a relatively long time to perform local oxidation of silicon to form a field oxide layer with the thickness of 2 μm, and the formed field oxide layer is obviously about 1 μm higher than the silicon top surface. As shown in FIG. 1, oxide layer 14 is formed in the local area of the SOI substrate (including bottom silicon 11, buried oxide layer 12, and top silicon 13), which is obviously higher than the upper surface of the SOI substrate. Although a polycrystalline silicon gate can be prolonged directly thereon to adjust the electric field of the drift region, the above-surface height readily has the impact on the accuracy of subsequent photoetching. Therefore, in order to solving the problem of the prior art, there is a need for a manufacturing method of SOI high-voltage power devices.

SUMMARY OF THE INVENTION

Consistent with embodiments of the present invention, in order to avoid problems such as photoetching accuracy decrease caused by the incident that the oxide layer is higher than the SOI substrate, a manufacturing method of SOI high-voltage power devices is provided.

The method comprises steps of:

(A) forming a first oxide layer in a section on the surface of the SOI substrate, which comprises a bottom layer, an buried oxide layer, and a top silicon successively, to reduce the thickness of the top silicon in the corresponding section of the SOI substrate;

(B) removing the first oxide layer to expose the corresponding part of the top silicon under the first oxide layer, to form a depressed area in the corresponding section of the surface of the SOI substrate;

(C) forming a second oxide layer, the upper surface of which is as high as the that of the SOI substrate, in the depressed area formed in step (B);

(D) performing photoetching and doping processes to form a P-type region, an N-type region and a gate region on the thus-formed structure where the second oxide layer is formed, wherein the P-type region and the N-type region are the drain region and the source region of the high-voltage power device respectively;

(E) forming a third oxide layer by deposition on the drift region of the structure where P-type and N-type regions are formed; wherein the total thickness of the third oxide layer and the second oxide layer approximates to the thickness of the buried oxide layer in the SOI substrate; and (F) forming metal sub-regions, which are respectively in contact with the P-type region, the N-type region and the gate region, on the structure where the third oxide layer is formed, thereby forming a high-voltage power device.

Preferably, the metal sub-region which is in contact with the gate region is a metal field plate, one end of the metal field plate is close to the metal sub-region that contacts with the drain region and the other end of the metal field plate is in contact with the gate region.

Preferably, the gate region is made of polycrystalline silicon.

Preferably, the formed P-type region comprise: a P-well (body) region, an ohm contact region, and a P-type body contact region that are formed in sequence by doping the top silicon of the SOI substrate; the formed N-type region can be an ohm contact region.

Besides, the high-voltage power device formed according to the method of the present invention is a lateral device, for example, a lateral double-diffused field effect transistor or a lateral insulate-gate bipolar transistor (IGBT).

In conclusion, according to the method for fabricating SOI high-voltage power devices provided in the present invention, after two steps of local oxidation, a field oxide layer, being as approximately high as the top of the SOI substrate, could be formed; and after subsequent photoetching process, an oxide layer with a certain thickness is deposited on the drift region to form a symmetrical structure where the thickness of the oxide layer on the top silicon of the SOI substrate is approximately equal to that of the oxide layer under the top silicon of the SOI substrate after reduction, thereby effectively solving the problems such as inaccuracy of photoetching caused by non-flatness of the top surface. The high-voltage power device formed in the present invention could satisfy requirement of high-voltage (such as 700V or above).

DETAILED DESCRIPTION OF THE EMBODIMENTS

The present invention is further explained in detail according to the accompanying drawings.

Figure 1:
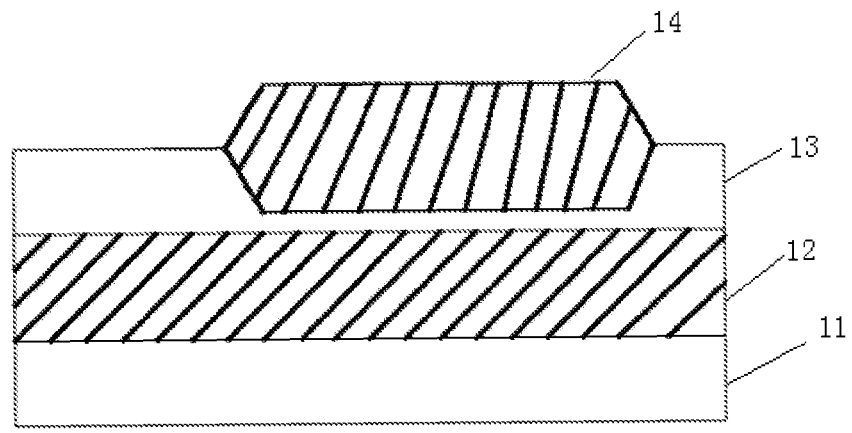
FIG. 1 is a schematic diagram of the LOCOS technology in the prior art.
Figure 2A:
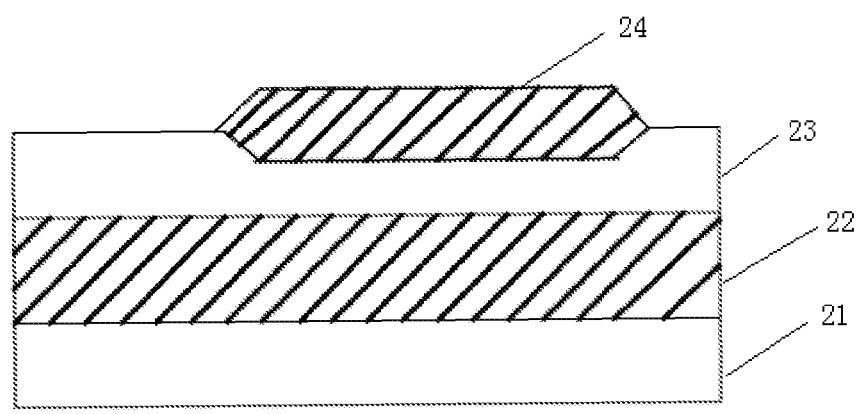
FIGS. 2a-2d is the technical flow chart of manufacturing method of SOI high-voltage power devicee according to the present invention.

A method for fabricating an SOI high-voltage power device according to the present invention mainly comprises the following steps:

Step (A), form a first oxide layer 24 in a section on the surface of the SOI substrate, which includes bottom layer 21, buried oxide layer 22, and top silicon 23, so as to reduce the thickness of the top silicon in the corresponding section of the SOI substrate. As shown in FIG. 2a, the first oxide layer 24 can be formed using the thermal oxidation method; optionally, other methods can be used, which are known from the prior art by those skilled in the art, and do not need more detailed explanation here. In addition, if the fabricated SOI high-voltage power device is a lateral double-diffused field effect transistor, the bottom layer 21 could be an N-type heavily-doped substrate, or a P-type heavily-doped substrate.

Figure 2B:
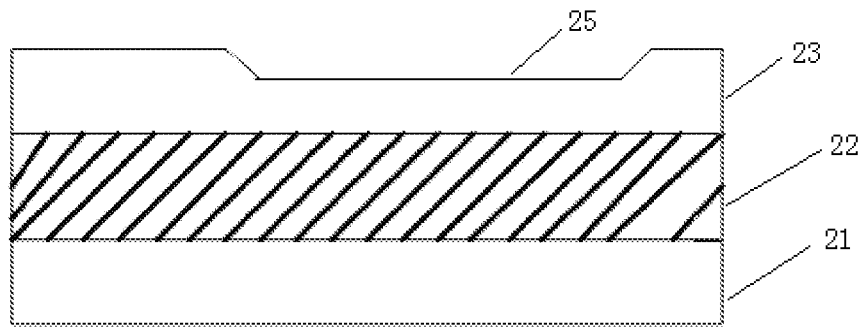

Step (B), remove the first oxide layer 24 so that part of the top silicon under the first oxide layer 24 is exposed, thereby forming a depressed area 25 in the corresponding section on the surface of the SOI substrate, as shown in FIG. 2b.

Figure 2C:
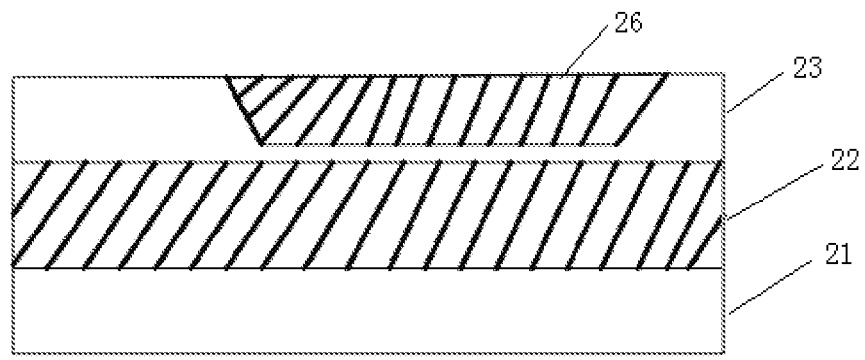

Step (C), form a second oxide layer 26 in the depressed area 25, such that the upper surface of the second oxide layer 26 is as high as that of the SOI substrate, as shown in FIG. 2c. As the surface of the top silicon is exposed after the oxide layer 24 formed in the first step being removed, oxidation proceeds at a relatively fast speed and the top surface of the second oxide layer finally formed is as approximately high as that of the top silicon.

Figure 2D:
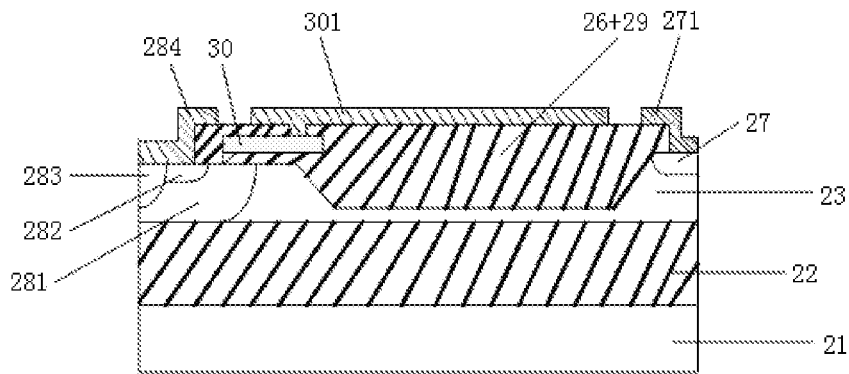

Step (C), perform photoetching, doping, and growing processes on the structure where the second oxide layer 26 is formed, so as to respectively form a P-type region and an N-type region that serve as the drain and the source of the high-voltage power device, and form a gate region 30. As shown in FIG. 2d, in this embodiment, the N-type region is ohm contact region 27, the P-type region includes P-well (body) region 281, ohm contact region 282, and P-type body contact region 283; and the gate region 30 can be made of polycrystalline silicon.

Step (D), a third oxide layer 29 is deposited on the drift region of the structure where P-type and N-type regions are formed so that the total thickness of the third oxide layer 29 and the second oxide layer 26 (i.e. the total thickness of 26 and 29) approximates to the thickness of the buried oxide layer 22 in the SOI substrate. Because the structure formed in the preceding steps (i.e. LOCOS structure) is relatively thin, polycrystalline silicon cannot be directly elongated; otherwise, the breakdown voltage is thus relatively low. To this end, after performing the preceding steps involving photoetching, another oxide layer (i.e. the third oxide layer) should be deposited on the LOCOS structure, and the combination of the third oxide layer 29 and the second oxide layer 26 could formis a symmetrical structure with respect to the buried oxide layer 22.

Figure 3:
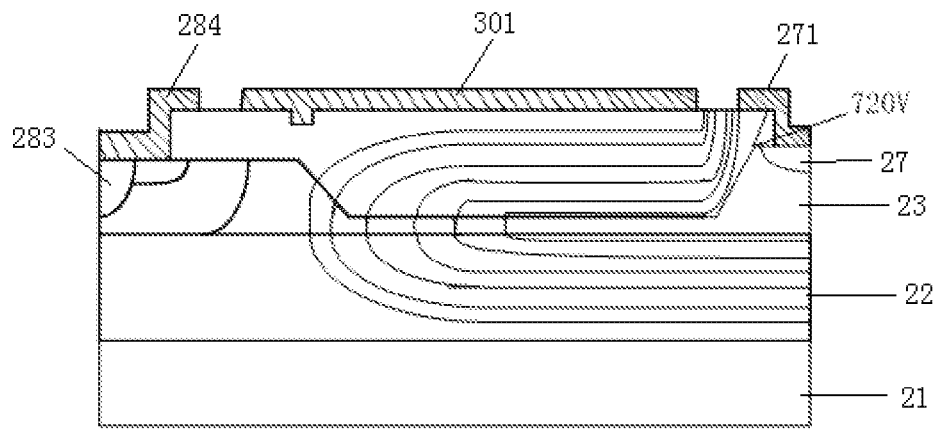
FIG. 3 is a schematic diagram of equipotential line distribution for the device formed according to the method for fabricating an SOI high-voltage power device provided in the present invention.

Step (E), on the third oxide layer 29, metal sub-region 284, metal sub-region 271, and metal sub-region 301 that are respectively in contact with the P-type region, the N-type region, and the gate region 30 are formed, thereby forming a high-voltage power device. As shown in FIG. 2d, the metal sub-region 301 which is in contact with the gate region 30 is a metal field plate, one end of the metal field plate is close to the metal sub-region 271 which is in contact with the drain region 27 and the other end of the metal field plate is in contact with the gate region 30. FIG. 3 shows the distribution of the equipotential line of the finally-formed high-voltage power device. With a drift region as long as 50 μm, the high-voltage power device can withstand 700 V or above voltage (a device formed according to this embodiment can withstand 720 V) and exhibits a lower ON resistance compared with the traditional device.

After performing the aforesaid steps, a lateral device, for example, a lateral double-diffused field effect transistor (LD-MOS) or a lateral insulate-gate bipolar transistor (LIGBT), can be fabricated according to the present invention.

It should be noted that the process, the means, and the conditions applied in the above-mentioned steps are already know by those skilled in the art, and therefore will not be detailed herein.

To sum up, according to the method for fabricating an SOI high-voltage power device provided in the present invention, an oxide layer as approximately high as the top of the SOI substrate can be prepared after two steps of local oxidation; after subsequent steps involving photoetching, another oxide layer with a certain thickness is deposited on the drift region to form a symmetrical structure where the thickness of the oxide layer on the top silicon and that of the oxide layer under the top silicon after reduction is approximately equal to each other; in order to effectively control the electric charge in the drift region, a metal field plate is prolonged on the oxide layer, such that the thus-formed high-voltage power device can withstand 700 V or above voltage, thereby effectively avoiding the problems in the existing technology, for example, the accurary of the subsequent photoetching is affected by the incident that the oxide layer is higher that the top surface of the SOI substrate.

The above description of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A manufacturing method of SOI high-voltage power devices, comprising:
   (A) forming a first oxide layer in a section on a surface of the SOI substrate, which comprises a bottom layer, an buried oxide layer, and a top silicon successively, to reduce the thickness of the top silicon in the corresponding section of the SOI substrate;
   (B) removing the first oxide layer to expose the corresponding part of the top silicon under the first oxide layer, to form a depressed area in the corresponding section of an upper surface of the SOI substrate;
   (C) forming a second oxide layer, the upper surface of which is as high as the that of the SOI substrate, in the depressed area formed in step (B);
   (D) performing photoetching and doping processes to form a P-type region, an N-type region and a gate region on the thus-formed structure where the second oxide layer is formed, wherein the P-type region and the N-type region are a drain region and a source region of the high-voltage power device respectively;
   (E) forming a third oxide layer by deposition on a drift region of the structure where the P-type and the N-type regions are formed; wherein the total thickness of the third oxide layer and the second oxide layer approximates to the thickness of the buried oxide layer in the SOI substrate; and
   (F) forming metal sub-regions, which are respectively in contact with the P-type region, the N-type region and the gate region, on the structure where the third oxide layer is formed, thereby forming a high-voltage power device.

2. The manufacturing method of SOI high-voltage power devices in claim 1, wherein each of the metal sub-regions which are in contact with the gate region is a metal field plate, one end of the metal field plate is close to the metal sub-region that contacts with the drain region and the other end of the metal field plate is in contact with the gate region.

3. The manufacturing method of SOI high-voltage power devices in claim 1, wherein the gate region is made of polycrystalline silicon.

4. The manufacturing method of SOI high-voltage power devices in claim 1, wherein the formed P-type region comprise: a P-well (body) region, an ohmic contact region and a P-type body contact region.

5. The manufacturing method of SOI high-voltage power devices in claim 1, wherein the formed N-type region is an ohm contact region.

6. The manufacturing method of SOI high-voltage power devices in claim 1, wherein the high-voltage power device formed in step (F) is a lateral device.

7. The manufacturing method of SOI high-voltage power devices in claim 6, wherein the lateral device is either a lateral double-diffused field effect transistor or a lateral insulate-gate bipolar transistor.

* * * * *